United States Patent
Deivasigamani et al.

(10) Patent No.: US 7,116,143 B2
(45) Date of Patent: Oct. 3, 2006

(54) SYNCHRONOUS CLOCK GENERATOR INCLUDING DUTY CYCLE CORRECTION

(75) Inventors: Vinoth Kumar Deivasigamani, Madison, WI (US); Tyler Gomm, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 27 days.

(21) Appl. No.: 11/027,343

(22) Filed: Dec. 30, 2004

(65) Prior Publication Data

US 2006/0145745 A1 Jul. 6, 2006

(51) Int. Cl.
*H03L 7/06* (2006.01)

(52) U.S. Cl. .................. 327/149; 327/158; 327/161

(58) Field of Classification Search ............... 327/291, 327/293, 294, 141, 146, 149, 158, 153–156, 327/161–163
See application file for complete search history.

(56) References Cited

U.S. PATENT DOCUMENTS

| | | | |
|---|---|---|---|
| 5,727,037 A | 3/1998 | Maneatis ................ 375/376 |
| 5,923,613 A | 7/1999 | Tien et al. ............... 365/233 |
| 5,940,609 A | 8/1999 | Harrison ................. 395/558 |
| 6,281,725 B1 | 8/2001 | Hanzawa et al. ........ 327/152 |
| 6,342,801 B1 | 1/2002 | Shin ........................ 327/175 |
| 6,388,480 B1 * | 5/2002 | Stubbs et al. ........... 327/156 |
| 6,452,432 B1 * | 9/2002 | Kim ........................ 327/158 |
| 6,483,359 B1 * | 11/2002 | Lee ........................ 327/158 |
| 6,489,823 B1 * | 12/2002 | Iwamoto ................. 327/158 |
| 6,498,512 B1 | 12/2002 | Simon et al. ............. 326/93 |
| 6,518,809 B1 | 2/2003 | Kotra ..................... 327/175 |
| 6,549,041 B1 * | 4/2003 | Waldrop ................... 327/5 |
| 6,573,771 B1 * | 6/2003 | Lee et al. ............... 327/158 |
| 6,605,969 B1 * | 8/2003 | Mikhalev et al. ......... 327/158 |
| 6,677,792 B1 | 1/2004 | Kwak ..................... 327/158 |
| 6,765,421 B1 | 7/2004 | Brox et al. .............. 327/175 |
| 6,774,690 B1 | 8/2004 | Baker et al. ............. 327/158 |
| 6,788,120 B1 | 9/2004 | Nguyen .................. 327/172 |
| 6,853,225 B1 | 2/2005 | Lee ........................ 327/158 |
| 6,853,226 B1 * | 2/2005 | Kwak et al. ............. 327/159 |
| 6,859,081 B1 | 2/2005 | Hong et al. ............. 327/175 |
| 2001/0026183 A1 | 10/2001 | Kim ....................... 327/276 |
| 2003/0099321 A1 | 5/2003 | Juan et al. .............. 375/376 |
| 2004/0008064 A1 | 1/2004 | Kashiwazaki ............ 327/158 |
| 2004/0012428 A1 | 1/2004 | Yee et al. ................ 327/175 |

(Continued)

OTHER PUBLICATIONS

Tatsuya, M. et al., "A 1-Gb/s/pin 512-Mb DDRII SDRAM Using a Digital DLL and a Slew-Rate-Controlled Output Buffer", IEEE Journal of Solid-State Circuits, vol. 38, No. 5, May 2003. pp. 762-768.

*Primary Examiner*—Timothy P. Callahan
*Assistant Examiner*—Hai L. Nguyen
(74) *Attorney, Agent, or Firm*—Dorsey & Whitney LLP

(57) ABSTRACT

A clock generator for generating an output clock signal synchronized with an input clock signal and having a corrected duty cycle. The clock generator includes an input buffer to buffer the input clock signal and generate a buffered clock signal and an output buffer to generate the output clock signal in response to first and second clock signals applied to first and second inputs. An adjustable delay loop coupled to the output of the input buffer and coupled to the first and second inputs of the output buffer has a single feedback delay loop and is configured to generate a first clock signal and a second clock signal. The second clock signal is out of phase from the first clock signal by 180 degrees.

48 Claims, 8 Drawing Sheets

U.S. PATENT DOCUMENTS

| | | |
|---|---|---|
| 2004/0027182 A1 | 2/2004 | Brox et al. ............... 327/158 |
| 2004/0066873 A1 | 4/2004 | Cho et al. ............... 375/376 |
| 2004/0155686 A1 | 8/2004 | Kim et al. ............... 327/158 |
| 2004/0178835 A1 | 9/2004 | Kim ............... 327/158 |
| 2004/0189364 A1 | 9/2004 | Lee et al. ............... 327/175 |

* cited by examiner

SYNCHRONOUS CLOCK GENERATOR INCLUDING DUTY CYCLE CORRECTION

TECHNICAL FIELD

The present invention relates generally to integrated circuits, and more specifically, to clock generator that generates an output clock signal having a corrected duty cycle and that is synchronized with an input clock signal provided to the clock generator.

BACKGROUND OF THE INVENTION

In synchronous integrated circuits, the integrated circuit is clocked by an external clock signal and performs operations at predetermined times relative to the rising and falling edges of the applied clock signal. Examples of synchronous integrated circuits include synchronous memory devices such as synchronous dynamic random access memories (SDRAMs), synchronous static random access memories (SSRAMs), and packetized memories like SLDRAMs and RDRAMs, and include other types of integrated circuits as well, such as microprocessors. The timing of signals external to a synchronous memory device is determined by the external clock signal, and operations within the memory device typically must be synchronized to external operations. For example, read data are placed on a data bus by the memory device in synchronism with an external clock signal. The memory device must latch and drive the data onto the data bus at the proper times to successfully provide the read data. To latch the read data and drive it onto the data bus, an internal clock signal is developed in response to the external clock signal, and is typically applied to the data latches and data drivers contained in the memory device to thereby clock the data onto the data bus. The internal clock signal and external clock must be synchronized to ensure the internal clock signal clocks the latches and data drivers at the proper times to successfully provide the read data. In the present description, "external" is used to refer to signals and operations outside of the memory device, and "internal" to refer to signals and operations within the memory device. Moreover, although the present description is directed to synchronous memory devices, the principles described herein are equally applicable to other types of synchronous integrated circuits.

Internal circuitry in the memory device that generates the internal clock signal necessarily introduces some time delay, causing the internal clock signal to be phase shifted relative to the external clock signal. As long as the phase-shift is minimal, timing within the memory device can be easily synchronized to the external timing. To increase the rate at which commands can be applied and at which data can be transferred to and from the memory device, the frequency of the external clock signal is increased, and in modern synchronous memories the frequency is in excess of 500 MHz. As the frequency of the external clock signal increases, however, the time delay introduced by the internal circuitry becomes more significant. This is true because as the frequency of the external clock signal increases, the period of the signal decreases and thus even small delays introduced by the internal circuitry correspond to significant phase shifts between the internal and external clock signals. As a result, the commands applied to the memory device may no longer be valid by the time the internal clock signal clocks the latches. Additionally, as the frequency of the external clock increases, variations in the duty cycle of the clock signal introduce a greater duty cycle error. An ideal duty cycle for a clock signal is typically 50 percent. That is, over the period of a clock cycle, the clock signal is HIGH for 50 percent of the period. As the period of the clock signals become shorter due to the increased clock frequency, a clock variation that results in a subtle shift in duty cycle, and which can be ignored at a lower clock frequency, may result in a much more significant shift in the duty cycle of the higher frequency clock signal. In some instances, if the duty cycle of the clock signal is left uncorrected, timing errors may cause the memory device to fail.

To synchronize external and internal clock signals in modern synchronous memory devices, a number of different approaches have been considered and utilized, including delay-locked loops (DLLs), as will be appreciated by those skilled in the art. As used herein, the term synchronized includes signals that are coincident and signals that have a desired delay relative to one another. To correct duty cycle errors in clock signals, duty cycle correction (DCC) circuits are used to generate clock signals having a 50 percent duty cycle. FIG. 1 illustrates a conventional clock generator 100 having a DLL 110 and a DCC circuit 120. An input clock signal CLK represents an external clock signal applied to the DLL. As will be explained in more detail below, the DLL generates an output clock signal CLK0 that is synchronized with the CLK signal. Due to the design of conventional DLLs, a duty cycle error in the CLK signal will be carried through to the CLK0 signal. Thus, the CLK0 signal is provided to the DCC 120 to correct any duty cycle error and generate an output clock signal CLKSYNC that is synchronized with the CLK0 signal and has a duty cycle corrected to 50 percent.

FIG. 2 illustrates the conventional DLL 110 and the DCC circuit 120 in greater detail. The DLL includes an input buffer 202 that provides a buffered clock signal CLKBUF in response to receiving the CLK signal. The CLKBUF signal is delayed relative to the CLK signal due to a propagation delay of the input buffer 202. The CLKBUF signal is provided to a variable delay circuit 204 that has a variable delay Td controlled by an adjustment signal DADJ1 generated by a shift register 206. The output clock signal of the variable delay is the CLK0 signal, which is delayed relative to the CLKBUF signal by the variable delay Td. An output clock signal CLKSYNC is fed back through a model delay 208 to provide a feedback clock signal CLKFB1. The model delay 208 adds a delay Tm to the CLKSYNC signal, which is approximately equal to the total delay of the input buffer 202, an output buffer 240, which is included in the DCC 120, and delay that is injected by the DCC 120 to the CLK0 signal and a CLK180 signal. A phase detector compares the CLKBUF and CLKFB1 signals, and generates a control signal DCONT1 for the shift register 206 in response to the phase difference between the CLKBUF and CLKFB1 signals. The variable delay circuit 204 is adjusted until the variable delay Td is sufficient to synchronize the CLKBUF and CLKFB1 signals. When the CLKBUF and CLKFB1 signals are in phase, the DLL 110 is said to be "locked." Under this condition, the timing of the CLK0 signal is such that the delay of the output buffer 240 is accommodated, and a clock signal output by the output buffer 240 would be in phase with the CLK signal. As known in the art, when the CLKBUF and CLKFB1 signals are in phase, the delay of the DLL feedback loop, generally defined by the variable delay 204 and the model delay 208, is a multiple of the period TCLKBUF of the CLKBUF signal. That is, the feedback loop delay is equal to n*TCLKBUF, where "n" is an integer value.

As previously mentioned, the CLK0 signal is provided to the DCC circuit 120 for duty cycle correction. The DCC circuit 120 includes a first variable delay 230 and a second variable delay 232, which are coupled in series. An output clock signal CLKFB2 of the variable delay 232 is compared with the CLK0 signal by a phase detector 238. The phase detector 238 generates a control signal DCONT2 that is provided to a shift register 234. The shift register 234 generates an adjustment signal DADJ2 based on the DCONT2 signal that is used to adjust both the variable delay 230 and the variable delay 232 to the same delay. When the variable delays 230, 232 have been adjusted so that the phase difference between the CLK0 and CLKFB2 signals is an odd multiple of the clock period of the CLK0 signal an output clock signal CLK180 from the first variable delay 230 is 180 degrees out of phase from the CLK0 signal. As known in the art, the delay of the feedback loop for the DCC 120, which is generally defined by the variable delays 230 and 232, is equal to one period of the CLK0 signal. Thus, one-half the loop delay, that is, the delay of one of the variable delays 230 or 232, will provide a delay equal to one-half the period of the CLK0 signal, which is a clock signal 180 degrees out of phase from the CLK0 signal. The CLK0 and CLK180 signals are used by the output buffer 240 to generate the CLKSYNC signal, which is synchronized with the CLK signal and has a corrected duty cycle.

Although the clock generator 100 provides a synchronized clock signal having a corrected duty cycle, the circuit is slow to generate the CLKSYNC signal upon startup and is cumbersome. The conventional clock generator 100 is slow because two different feedback loops must be locked before an acceptable CLKSYNC signal is generated. That is, upon start up, the DCC 120 must be synchronized before the DLL 110 is activated to provide a clock signal having the appropriate delay relative to the CLK signal or the DLL 110 is synchronized before the DCC 120 is activated for duty cycle correction. In the event the DLL 110 is synchronized before the DCC 120 is activated, the time required to generate a synchronized CLK0 signal can take several hundred clock cycles. The DCC 120 then takes additional time for it to adjust the variable delays 230 and 234 to synchronize the CLK0 signal and the CLKFB signal to provide a suitable CLK180 signal. The time for the DCC 120 to lock can add a significant amount of time to the already lengthy time it takes to lock the DLL 110. The clock generator 100 is cumbersome because the circuit includes nearly two complete DLLs. That is, the clock generator 100 includes three different variable delay circuits 204, 230, 232, two phase detectors 210, 238, and two shift registers 206, 234. A variable delay typically takes up a relatively large amount of space on a semiconductor substrate on which the clock generator and other components of a memory device are formed. Having multiple variable delays only exacerbates the issue and can be undesirable where the general design goal is reducing circuit size. Moreover, a variable delay has relatively high power consumption, which may be particularly undesirable in low-power applications, such as in a portable battery-operated device. Having multiple variable delays only increases power consumption, making a potentially undesirable situation even worse.

Therefore, there is a need for an alternative clock generator that combines the functions of a DLL and DCC circuit and reduces the number of redundant circuits.

SUMMARY OF THE INVENTION

The present invention is directed to a clock generator for generating an output clock signal synchronized with an input clock signal and having a corrected duty cycle. In one aspect of the invention, the clock generator includes an input buffer to buffer the input clock signal and generate a buffered clock signal. The clock generator further includes an output buffer to generate the output clock signal in response to first and second clock signals applied to first and second inputs. An adjustable delay loop coupled to the output of the input buffer and further coupled to the first and second inputs of the output buffer, has a single feedback delay loop and is configured to generate a first clock signal and a second clock signal where the second clock signal is out of phase from the first clock signal by 180 degrees.

In another aspect of the invention, a method for generating a delayed clock signal synchronized with a reference clock signal and having a corrected duty cycle includes delaying the reference clock signal by a total delay equal to an odd multiple of a period of the reference clock signal. The total delay includes an input buffer delay, an adjustable delay, a fixed delay, and an output buffer delay. The method further includes generating a first clock signal having a first delay relative to the reference clock signal equal to the input buffer delay and half of the adjustable delay and generating a second clock signal having a second delay relative to the reference clock signal equal to the input buffer delay, the adjustable delay, and the fixed delay. In a time equal to the output buffer delay, the first clock signal and a second clock signal are combined to provide the delayed clock signal.

DETAILED DESCRIPTION OF PREFERRED EMBODIMENTS

Embodiments of the present invention are directed to a clock generator for generating an output clock signal that is in phase with an input clock signal and has a corrected duty cycle. Certain details are set forth below to provide a sufficient understanding of the invention. However, it will be clear to one skilled in the art that the invention may be practiced without these particular details. In other instances, well-known circuits, control signals, and timing protocols have not been shown in detail in order to avoid unnecessarily obscuring the invention.

Figure 3:
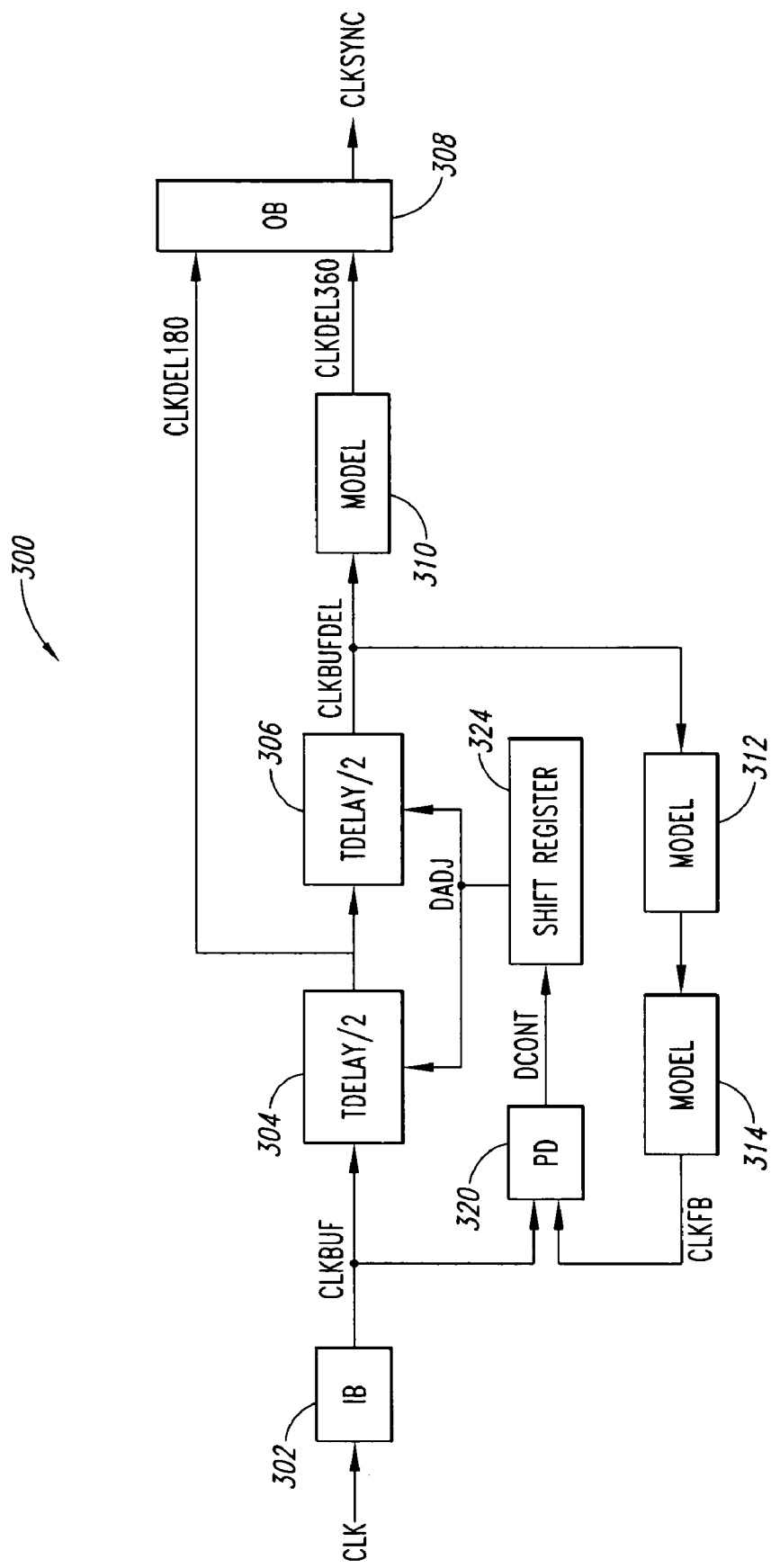
FIG. 3 is a functional block diagram of a clock generator according to an embodiment of the invention.

FIG. 3 is a clock generator 300 according to an embodiment of the present invention. As will be explained in more detail below, the clock generator 300 generates a clock signal CLKSYNC that is synchronized with an input clock signal CLK, and that has a duty cycle corrected to substantially a 50 percent duty cycle. The clock generator 300 includes an input buffer 302 that generates a buffered clock signal CLKBUF from the CLK signal. As previously discussed, the input buffer 302 introduces an input buffer delay Tib to the CLK signal. Thus, the CLKBUF signal is delayed relative to the CLK signal by the delay Tib. The CLKBUF signal is provided to a first variable delay 304 which generates a delayed clock signal CLKDEL180 having a variable delay Vd1 relative to the CLKBUF signal. The CLKDEL180 signal is provided to an output buffer 308 having an output buffer delay Tob. A second variable delay 306 coupled to the output of the first variable delay 304 generates a delayed buffered clock signal CLKBUFDEL having a variable delay Vd2 relative to the CLKDEL 180 signal. The CLKBUFDEL signal is provided to a model delay 310 which generates a delayed clock signal CLKDEL360 having a model delay Tm relative to the CLKBUFDEL signal. The Tm delay of the model delay 310 is approximately equal to the sum of the input buffer delay Tib of the input buffer 302 and the output buffer delay Tob of the output buffer 308. As will be explained in more detail below, the CLKDEL180 signal is 180 degrees out of phase from the CLKDEL360 signal when the first variable delay 304 and the second variable delay 306 are adjusted so that the total delay between the CLKBUF signal and a feedback clock signal CLKFB is equal to an odd multiple of the clock period TCLK of the CLKBUF signal. The CLKDEL180 and CLKDEL360 signals are used by the output buffer 308 to provide the CLKSYNC signal. The output buffer 308 generates the CLKSYNC signal having a duty cycle corrected to 50 percent using the CLKDEL180 and CLKDEL360 signals. The output buffer 308 is conventional, and output buffer circuits suitable for the output buffer 308 are well known in the art. Thus, a more detailed description of the output buffer 308 is not provided herein in the interest of brevity.

The CLKBUFDEL signal is further delayed through model delays 312, 314 to generate the CLKFB signal. Each of the model delays 312, 314 has a model delay of Tm that is approximately equal to the sum of the input buffer delay Tib and the output buffer delay Tob. The CLKFB signal is compared to the CLKBUF signal by a phase detector 320 which generates a control signal DCONT. The logic level of the DCONT signal is based on the phase relationship between the CLKBUF signal and the CLKFB signal. The DCONT signal is used by a shift register 324 to set a value that adjusts the variable delays Vd1, Vd2 of the variable delays 304, 306, respectively. As previously mentioned, the value of the shift register 324 is provided to both of the variable delays 304, 306 as an adjustment signal DADJ. Since the variable delays 304 and 306 have the respective variable delays Vd1, Vd2 set by the same DADJ signal, the delays of the variable delays 304 and 306 are the same. The variable delays Vd1 and Vd2 contribute to a total variable delay Td between the CLKBUF and CLKBUFDEL signals. As a result, with the variable delay Vd1 equal to the variable delay Vd2, and the delay Td being the sum of Vd1 and Vd2, each variable delay 304, 306 has a variable delay of Td/2.

In operation, the variable delay Td/2 of the variable delays 304, 306 are adjusted until the CLKBUF and CLKFB signals are in phase. The feedback loop can be referred to as being "locked" at this point. Generally, the DCONT signal will have a first logic level when the CLKFB signal is leading the CLKBUF signal. If the DCONT signal continues to have the first logic level for a minimum time, the value stored by the shift register 324 increases which in turn increases the variable delay Td/2 of the variable delays 304, 306. Conversely, when the CLKFB signal is lagging the CLKBUF signal, the DCONT signal has a second logic level, which, if maintained for the minimum time, the value stored by the shift register 324 decreases to decrease the variable delay Td/2 of the variable delays 304, 306. When the CLKBUF and the CLKFB signals are in phase, the logic level of the DCONT signal does not maintain the same logic level for the minimum time, and thus, the value stored by the shift register 324 neither increases or decreases. As a result, the variable delay Td/2 does not change.

When the CLKBUF and CLKFB signals are in phase, the feedback loop delay, generally defined by the variable delays 304, 306 and the model delays 312, 314, is equal to a multiple of the clock period TCLK of the CLKBUF signal, or N*TCLK, where N is an integer value. For the clock generator 300, the period TCLK of the CLKBUF signal is also the period of the CLK signal since the input buffer 302 does not affect the frequency or period of the CLK signal in delaying the CLK signal by Tib. Additionally, when the CLKBUF and CLKFB signals are in phase, the CLKDEL360 signal generated by the model delay 310 would be synchronized with the CLK signal if passed through an output buffer having an output buffer delay equal to Tob of the output buffer 308. That is, because the feedback loop delay is equal to N*TCLK, $N*TCLK=(Td/2+Td/2)+2*Tm$, where Tm is equal to (Tib+Tob), $N*TCLK=Td+2*Tm$, where Td is the total variable delay, $Td=N*TCLK-2*Tm.$ Thus, with Td equal to (N*TCLK−2*Tm), $CLKSYNC=CLK+Tib+Td+Tm+Tob,$ $CLKSYNC=CLK+Tib+(N*TCLK-2*Tm)+Tm+Tob,$ $CLKSYNC=CLK+Tib+N*TCLK-Tm+Tob,$ $CLKSYNC=CLK+N*TCLK.$ The result is that a CLKSYNC signal generated from only the CLKDEL360 signal is synchronized with the CLK signal, but delayed by some N multiple of the period of the CLK signal.

As previously mentioned, the CLKDEL180 signal output by the variable delay 304 is 180 degrees out of phase with the CLKDEL360 signal when the feedback loop is locked to an odd multiple of the TCLK period of the CLKBUF signal. This will now be described in greater detail. As previously discussed, the feedback loop of the variable delays 304, 306 and the model delays 312, 314 is locked when Td=N*TCLK−2*Tm. Solving the equation for N*TCLK provides N*TCLK=Td+2*Tm. For a clock signal that is 180 degrees out of phase from the CLKDEL360 signal, a signal that leads or lags the CLKDEL360 signal by a half-multiple of TCLK, or (N/2)*TCLK where N is an odd integer, is desired. Dividing the previous equation for N*TCLK by two provides (N/2)*TCLK=(Td/2)+Tm. Thus, a signal that is leading the CLKDEL360 signal by a delay of (Td/2)+Tm will be 180 degrees out of phase of the CLKDEL360 signal. As illustrated in FIG. 3, the CLKDEL180 signal leads the CLKDEL360 signal by a total delay of Td/2 (from the variable delay 306) and Tm (from the model delay 310), resulting in the CLKDEL180 signal being 180 degrees out of phase from the CLKDEL360 signal.

With the CLKDEL180 and CLKDEL360 signals available, the output buffer 308 can generate a CLKSYNC signal that is synchronized with the CLK signal and has a corrected duty cycle of 50 percent. In contrast with conventional clock generators that have a synchronized clock signal first generated by a DLL, that is then corrected by a DCC to have a duty cycle of 50 percent, the clock generator 300 includes only one feedback loop through the variable delays 304, 306 and the model delays 312, 314. In contrast, the conventional clock generator 100 has two feedback loops: one for the DLL 110 and another one for the DCC 120. Although the clock generator 300 includes additional model delays compared to the conventional clock generator 100, only one phase detector 320 and a pair of variable delays 304, 306 (having a total variable delay Td approximately equal to the variable delay 204 of the conventional clock generator 100) are needed to generate both the CLKDEL360 and CLKDEL180 signals. As previously discussed, the CLKDEL180 signal will be 180 degrees out of phase from the CLKDEL360 signal for odd multiples of TCLK. As known in the art, the total delay of the feedback loop can be designed so that the feedback loop locks on odd multiples of the period of the CLK signal.

Figure 4:
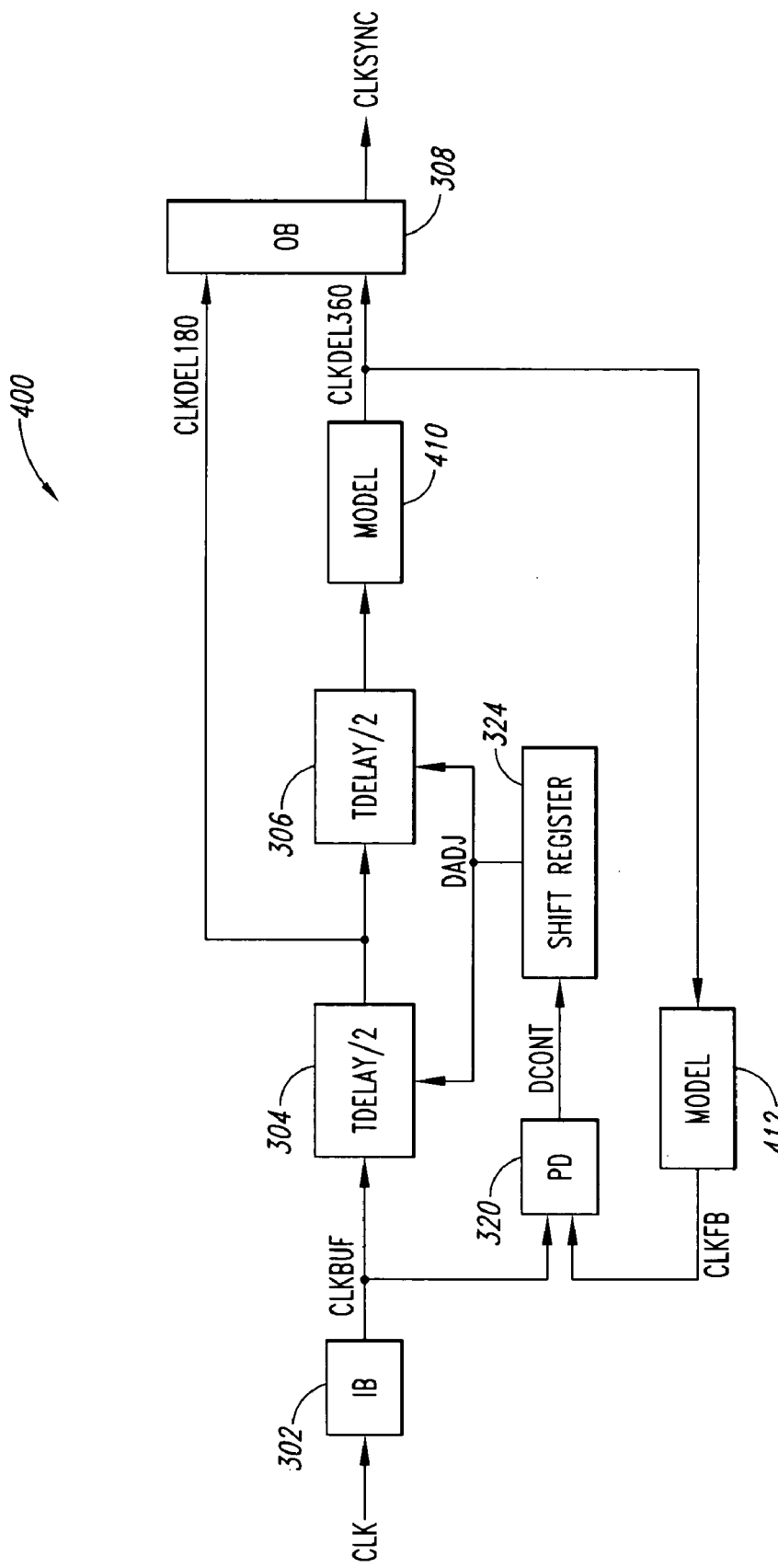
FIG. 4 is a functional block diagram of a clock generator according to an alternative embodiment of the invention.

FIG. 4 is a clock generator 400 according to an alternative embodiment of the present invention. The clock generator 400 includes elements that have been previously described with respect to the clock generator 300 of FIG. 3. Those elements have been shown in FIG. 4 using the same reference numbers used in FIG. 3. Operation of the common elements are as previously described. Consequently, a detailed description of the operation of these elements will not be repeated in the interest of brevity.

The clock generator 400 is similar to the clock generator 300 except that a CLKDEL360 signal is coupled from a different point and one of the model delays has been omitted. The clock generator 400 generates a CLKSYNC signal that is in phase with the CLK signal, and has a duty cycle corrected to 50 percent. The CLKSYNC signal is in phase with the CLK signal when the feedback loop, generally defined by the variable delays 304, 306 and the model delays 410, 412, is locked. That is when the CLKBUF signal and the CLKFB signal are in phase. Each of the model delays has a delay that is approximately equal to the sum of the input buffer delay Tib of the input buffer 302 and the output buffer delay Tob of the output buffer 308. As with the feedback loop of the clock generator 300, the feedback loop of the clock generator 400 is locked when the feedback loop delay is equal to a multiple of the period TCLK of the CLKBUF signal, or N*TCLK. That is, N*TCLK=(Td/2+Td/2)+Tm+Tm, which reduces to N*TCLK=Td+2*Tm. Thus, for the feedback loop of the clock generator 400 to lock, the variable delay Td should be adjusted to be equal to N*TCLK−2*Tm, as previously described with respect to the clock generator 300. With the variable delay Td set to N*TCLK−2*Tm, the CLKDEL360 signal provides a CLKSYNC signal that is in phase with the CLK signal if provided to an output buffer having a delay that is equal to Tob of the output buffer 308.

As with the clock generator 300, the clock generator 400 provides a CLKDEL180 signal that is 180 degrees out of phase from the CLKDEL360 signal at the output of the variable delay 304 when the feedback loop is locked to an odd multiple of the TCLK period of the CLKBUF signal. As previously discussed, a clock signal that leads the CLKDEL360 signal by one-half a period, that is, (N/2)*TCLK where N is an odd integer, will be 180 degrees out of phase from the CLKDEL360 signal. As previously shown, a signal that leads the CLKDEL360 signal by a time delay equal to (Td/2)+Tm satisfies this condition. The CLKDEL180, which leads the CLKDEL360 signal by (Td/2)+Tm, is consequently 180 degrees out of phase from the CLKDEL360 signal. The CLKDEL360 and CLKDEL180 signals are provided to the output buffer 308 to generate a CLKSYNC signal that is in phase with the CLK signal, and also has a duty cycle of 50 percent. As with the clock generator 300 of FIG. 3, the feedback loop can be designed having a total feedback loop delay such that the feedback loop of the variable delays 304, 306 and the model delays 410, 412 locks on an odd multiple of the period of the CLK signal.

Figure 5:
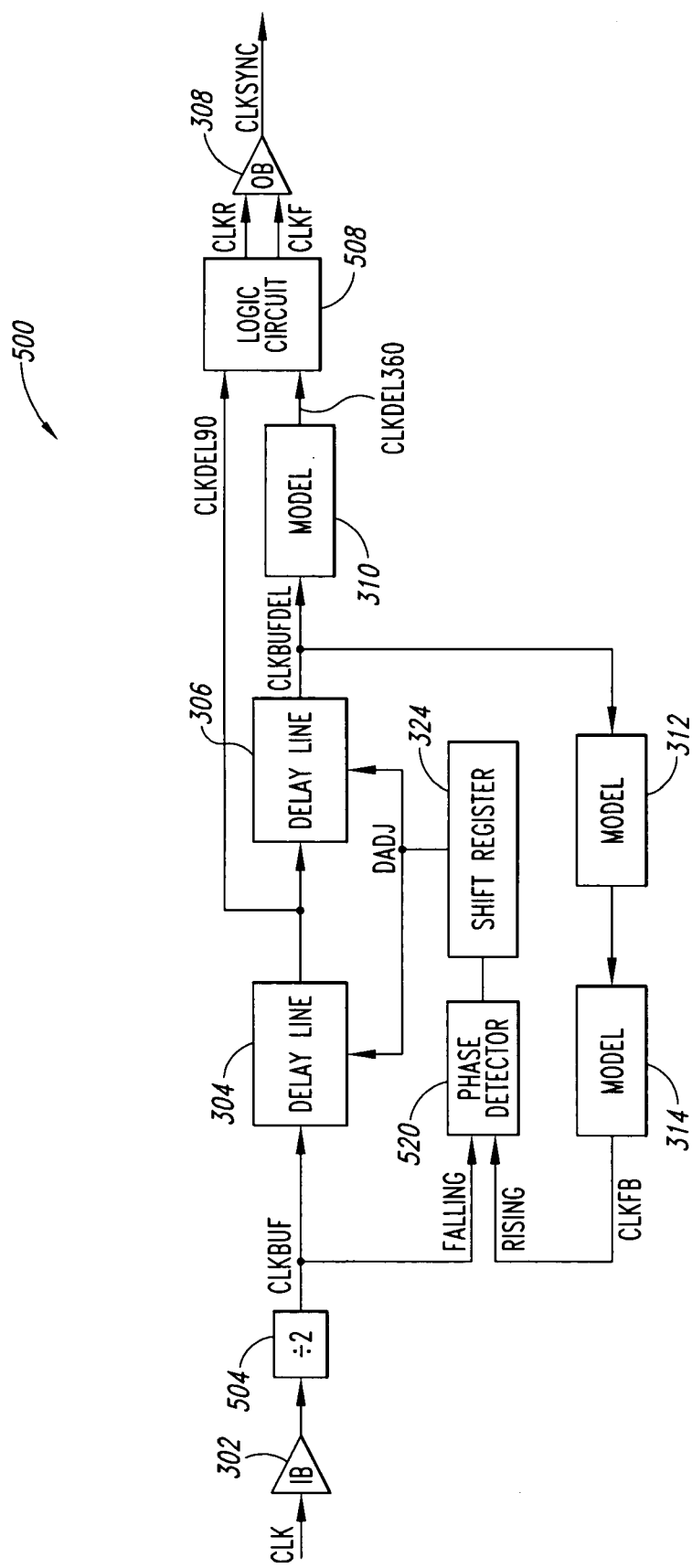
FIG. 5 is a functional block diagram of a clock generator according to an alternative embodiment of the invention.

FIG. 5 illustrates a clock generator 500 according to an alternative embodiment of the present invention. The clock generator 500 generates a clock signal CLKSYNC that is in phase with a clock signal CLK, and that has a duty cycle corrected to 50 percent. The clock generator 500 includes elements previously described with respect to the clock generators 300 and 400. These elements are referenced in FIG. 5 using the same reference numbers as in FIGS. 3 and 4, and a detailed description will not be repeated here in the interest of brevity. In contrast to the clock generators 300 and 400, the clock generator 500 includes a frequency divider 504 to divide the clock frequency of the CLK signal by two, and includes a phase detector 520 that compares the falling edge of the CLKBUF signal with the rising edge of the CLKFB signal. The clock generator 500 also includes a logic circuit 508 that receives a CLKDEL360 signal and a CLKDEL90 signal, which are at one-half the frequency of the CLK signal, and generates a first clock signal CLKR and a second clock signal CLKF that have frequencies that are the same as the CLK signal. The CLKR and CLKF signals are 180 degrees out of phase relative to each other. An output buffer 308 is coupled to the logic circuit 508 and receives the CLKR and CLKF signals, and in response, generates a CLKSYNC signal that is in phase with the CLK signal and has a duty cycle corrected to 50 percent.

Figure 6:
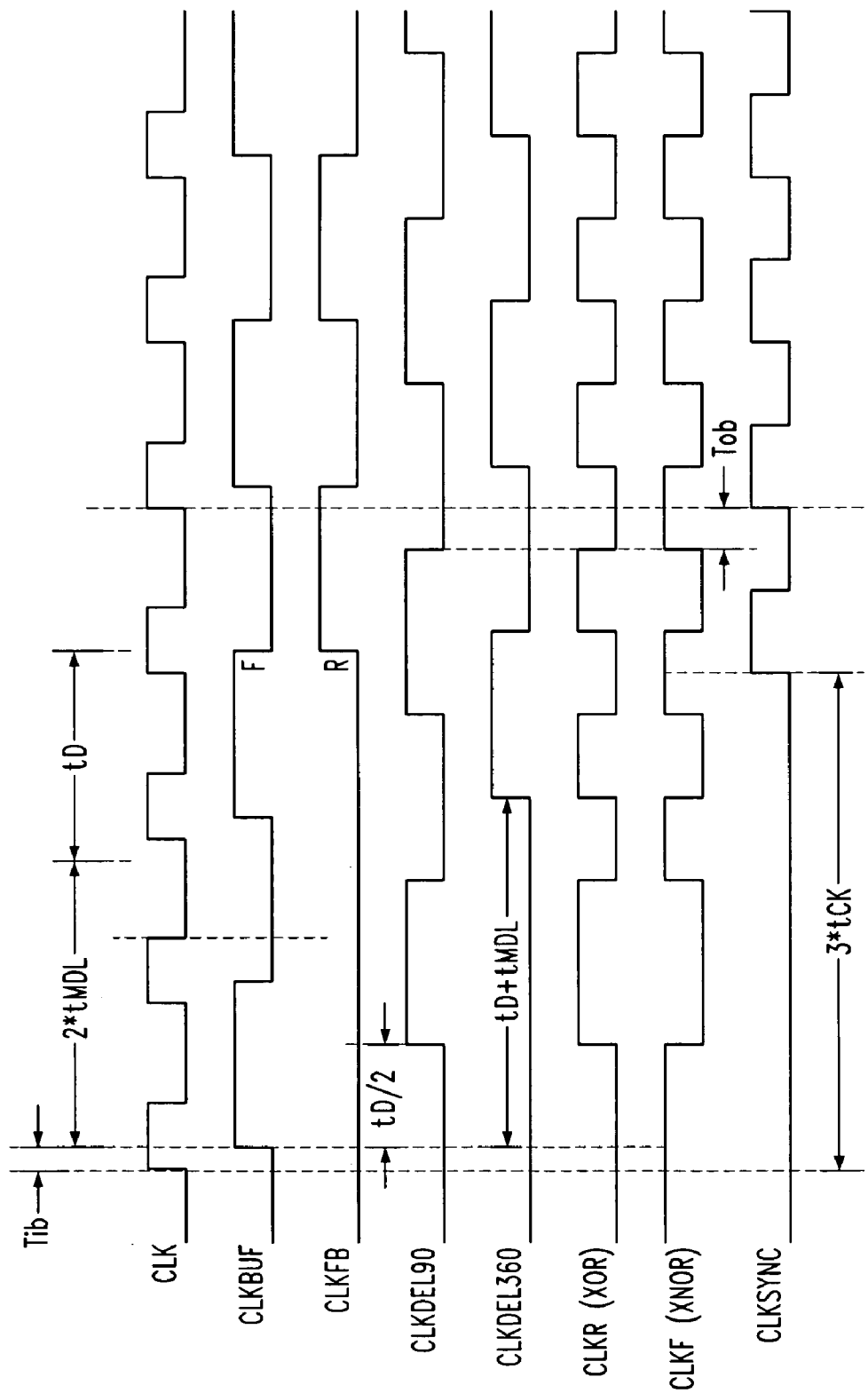
FIG. 6 is a timing diagram of various signals during the operation of the clock generator of FIG. 5.

Operation of the clock generator 500 is similar to the clock generators 300 and 400. However, by dividing the frequency of the CLK signal by two, and comparing the falling edge of the CLKBUF signal to the rising edge of the CLKFB signal, the clock generator 500 includes a feedback loop that forcibly locks on odd cycles of the CLK signal. FIG. 6 illustrates various clock signals during the operation of the clock generator 500. The frequency divider 504 generates a CLKBUF signal having one-half the frequency of the CLK signal. The CLKBUF signal lags the CLK signal by an input buffer delay of the input buffer 302 and a propagation delay of the frequency divider 504, the total delay shown in FIG. 6 as Tib. A CLKFB signal, which is delayed relative to the CLKBUF signal by a delay equal to Td+2*Tm (total delay of the variable delays 304, 306 and the model delays 312, 314) is coupled to the phase detector 520. As shown in FIG. 6, the CLKBUF and CLKFB signals are locked at 180 degrees out of phase due to the comparison of the falling edge of the CLKBUF signal with the rising edge of the CLKFB signal. That is, the variable delay of the variable delays 304, 306 have been adjusted so that the falling edge of the CLKBUF signal is aligned with the rising edge of the CLKFB signal. The times at which the falling edge of the CLKBUF signal is in phase with the rising edge of the CLKFB signal corresponds to the odd cycles of the CLK signals. As shown in FIG. 6, the feedback loop is locked when the variable delay Td is adjusted such that the total feedback loop delay is equal to 3*TCLK. Also shown in FIG. 6 is the CLKDEL360 signal that is delayed Td+Tm relative to the CLKBUF signal due to the variable delays 304, 306 and the model delay 310. The CLKDEL90 signal shown in FIG. 6 is delayed Td/2 relative to the CLKBUF signal due to the variable delay 304. The result is that the CLKDEL90 signal is not 180 degrees out of phase with the CLKDEL360 signal, as with the CLKDEL180 signal in the clock generators 300 and 400, but rather, the CLKDEL90 signal is out of phase with the CLKDEL360 signal by a multiple of 90 degrees.

The feedback loop delay of the variable delays 304, 306 and the model delays 312, 314, is equal to an integer multiple of the period of the CLKBUF signal plus one-half of the period of the CLKBUF signal, due to the comparison of the rising edge of the CLKFB signal with the falling edge of the CLKBUF signal. That is, $(n+(1/2))TCLKBUF=(Td/2)+(Td/2)+2*Tm$ where n is any integer. This equation reduces to $(n+(1/2))TCLKBUF=Td+2*Tm$. Dividing the equation by two provides $[(Td/2)+Tm]=(n/2)TCLKBUF+(1/4)TCLKBUF$. The delay $[(Td/2)+Tm]$ is the delay between the CLKDEL90 signal and the CLKDEL360 signal. Thus, the CLKBUF90 signal, which lags the CLKBUF360 signal by a total delay of $[(Td/2)+Tm]$, is a multiple of one-fourth of the period TCLKBUF, which results in a CLKBUF90 signal that is out of phase with the CLKBUF360 signal by a multiple 90 degrees.

Both the CLKDEL90 and CLKDEL360 signals are provided to the logic circuit 508, which uses the signals to generate the CLKR and CLKF signals that have frequencies equal to the CLK signal. As previously mentioned, the CLKR and CLKF signals are 180 degrees out of phase with respect to one another. Although not shown in FIG. 5, the logic circuit 508 includes an exclusive OR (XOR) gate for generating the CLKR signal and further includes an exclusive NOR (XNOR) gate for generating the CLKF signal. Alternative logic gates can be used as well, and the present example is merely an embodiment of the invention. The CLKR and CLKF signals are then provided to the output buffer 308 where the CLKR and CLKF signals are used to generate a CLKSYNC signal that is in phase with the CLK signal and also has a duty cycle corrected to 50 percent. The CLKSYNC signal is delayed relative to the CLKR and CLKF signal by a delay of the output buffer 308 to be synchronized with the CLK signal. As shown in FIG. 6, the delay Tob includes the propagation delay of the logic circuit 508 and the output buffer 308 in generating the CLKSYNC signal from the CLKDEL90 and CLK360 signals.

Figure 1:
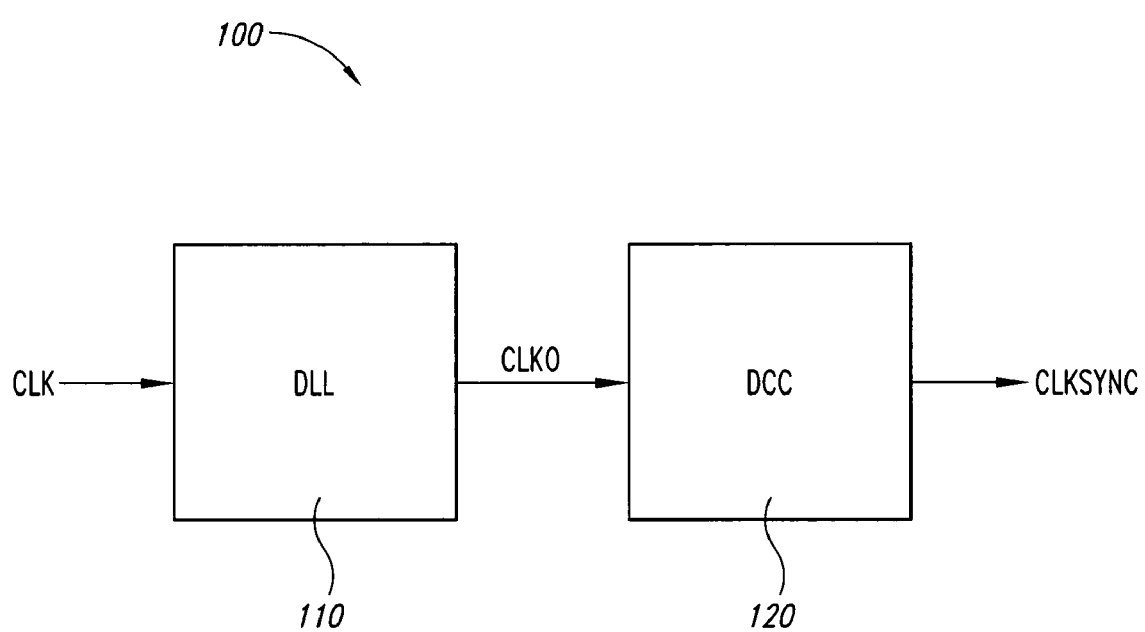
FIG. 1 is a functional block diagram of a conventional clock generator.
Figure 2:
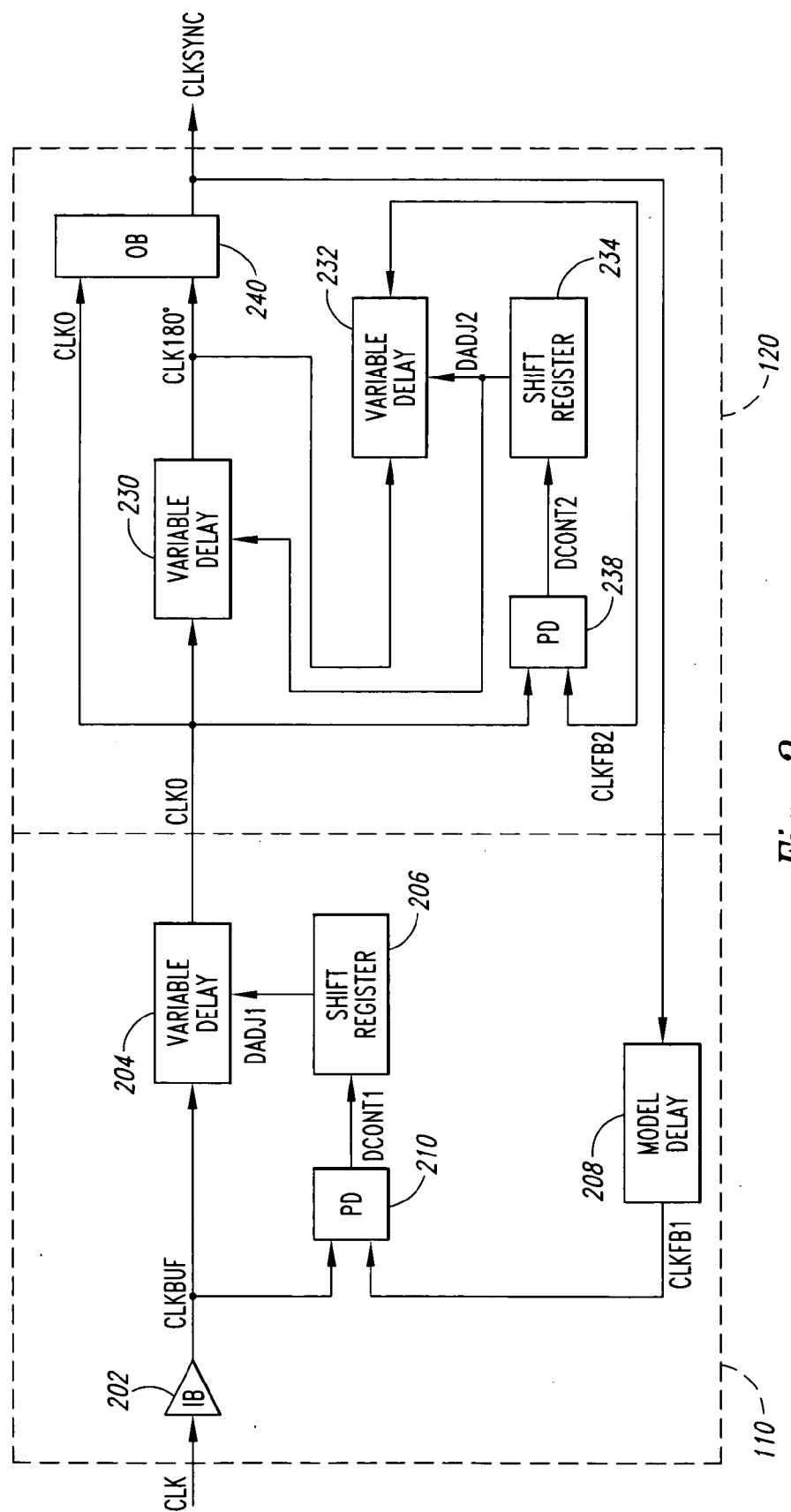
FIG. 2 is a functional block diagram of a conventional delay-locked loop and duty cycle correction circuit included in the conventional clock generator of FIG. 1.

In an alternative embodiment, the clock generator 400 is modified as shown in FIG. 5 to include a feedback loop that forcibly locks on odd cycles of the CLK signal. Such modifications can include modifying the clock generator 400 to include a frequency divider 504 and a logic circuit 508, and further having a phase detector compare rising and falling edges of the CLKBUF and CLKFB signals. In another embodiment of the invention, a conventional DCC, such as the DCC 120 (FIG. 2), can be modified as well by including a frequency divider, a logic circuit, and comparing rising and falling edges of the CLK0 and CLKFB2 signals to forcibly lock the feedback loop on odd cycles of the CLK0 signal. Such modifications can be made by those ordinarily skilled in the art based on the description provided herein.

Figure 7:
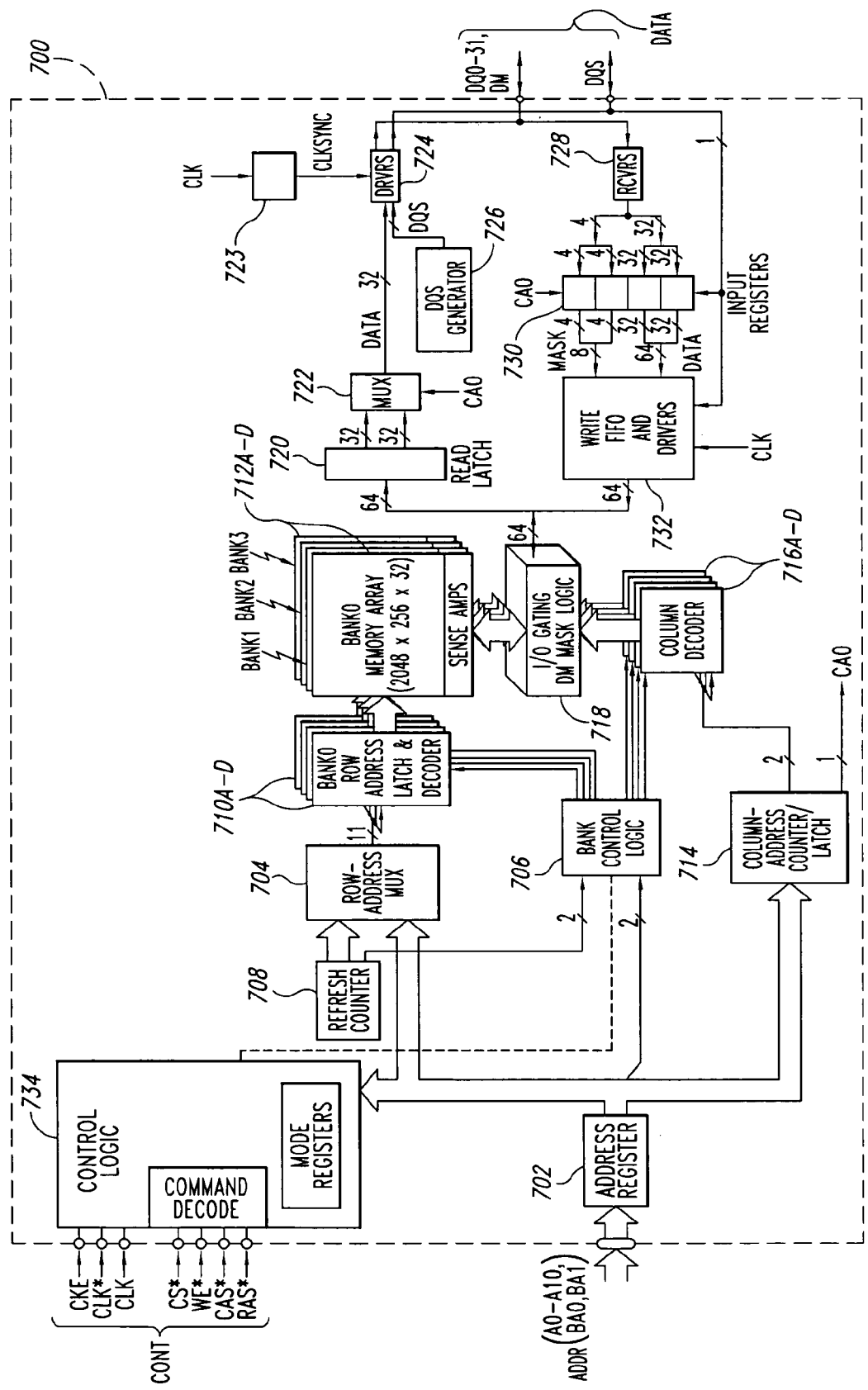
FIG. 7 is a functional block diagram illustrating a synchronous memory device including a clock generator according to an embodiment of the invention.

FIG. 7 is a functional block diagram of a memory device 700 including a clock generator 723 according to an embodiment of the present invention. The memory device 700 in FIG. 7 is a double-data rate (DDR) SDRAM, although the principles described herein are applicable to any memory device that may include a delay-locked loop for synchronizing internal and external signals, such as conventional synchronous DRAMs (SDRAMs), as well as packetized memory devices like SLDRAMs and RDRAMs, and are equally applicable to any integrated circuit that must synchronize internal and external clocking signals.

The memory device 700 includes an address register 702 that receives row, column, and bank addresses over an address bus ADDR, with a memory controller (not shown) typically supplying the addresses. The address register 702 receives a row address and a bank address that are applied to a row address multiplexer 704 and bank control logic circuit 706, respectively. The row address multiplexer 704 applies either the row address received from the address register 702 or a refresh row address from a refresh counter 708 to a plurality of row address latch and decoders 710A–D. The bank control logic 706 activates the row address latch and decoder 710A–D corresponding to either the bank address received from the address register 702 or a refresh bank address from the refresh counter 708, and the activated row address latch and decoder latches and decodes the received row address. In response to the decoded row address, the activated row address latch and decoder 710A–D applies various signals to a corresponding memory bank 712A–D to thereby activate a row of memory cells corresponding to the decoded row address. Each memory bank 712A–D includes a memory-cell array having a plurality of memory cells arranged in rows and columns, and the data stored in the memory cells in the activated row is stored in sense amplifiers in the corresponding memory bank. The row address multiplexer 704 applies the refresh row address from the refresh counter 708 to the decoders 710A–D and the bank control logic circuit 706 uses the refresh bank address from the refresh counter when the memory device 700 operates in an auto-refresh or self-refresh mode of operation in response to an auto- or self-refresh command being applied to the memory device 700, as will be appreciated by those skilled in the art.

A column address is applied on the ADDR bus after the row and bank addresses, and the address register 702 applies the column address to a column address counter and latch 714 which, in turn, latches the column address and applies the latched column address to a plurality of column decoders 716A–D. The bank control logic 706 activates the column decoder 716A–D corresponding to the received bank address, and the activated column decoder decodes the applied column address. Depending on the operating mode of the memory device 700, the column address counter and latch 714 either directly applies the latched column address to the decoders 716A–D, or applies a sequence of column addresses to the decoders starting at the column address provided by the address register 702. In response to the column address from the counter and latch 714, the activated column decoder 716A–D applies decode and control signals to an I/O gating and data masking circuit 718 which, in turn, accesses memory cells corresponding to the decoded column address in the activated row of memory cells in the memory bank 712A–D being accessed.

During data read operations, data being read from the addressed memory cells is coupled through the I/O gating and data masking circuit 718 to a read latch 720. The I/O gating and data masking circuit 718 supplies N bits of data to the read latch 720, which then applies two N/2 bit words to a multiplexer 722. The circuit 718 provides 64 bits to the read latch 720 which, in turn, provides two 32 bits words to the multiplexer 722. A data driver 724 sequentially receives the N/2 bit words from the multiplexer 722 and also receives a data strobe signal DQS from a strobe signal generator 726 and a delayed clock signal CLKDEL from the clock generator 723. The DQS signal is used by an external circuit such as a memory controller (not shown) in latching data from the memory device 700 during read operations. In response to the delayed clock signal CLKDEL, the data driver 724 sequentially outputs the received N/2 bits words as a corresponding data word DQ, each data word being output in synchronism with a rising or falling edge of a CLK signal that is applied to clock the memory device 700. The data driver 724 also outputs the data strobe signal DQS having rising and falling edges in synchronism with rising and falling edges of the CLK signal, respectively. Each data word DQ and the data strobe signal DQS collectively define a data bus DATA. As will be appreciated by those skilled in the art, the CLKDEL signal from the DLL is a delayed version of the CLK signal, and the clock generator 723 adjusts the delay of the CLKDEL signal relative to the CLK signal to ensure that the DQS signal and the DQ words are placed on the DATA bus in synchronism with the CLK signal, as previously described. The DATA bus also includes masking signals DM0-M, which will be described in more detail below with reference to data write operations.

During data write operations, an external circuit such as a memory controller (not shown) applies N/2 bit data words DQ, the strobe signal DQS, and corresponding data masking signals DM on the data bus DATA. A data receiver 728 receives each DQ word and the associated DM signals, and applies these signals to input registers 730 that are clocked by the DQS signal. In response to a rising edge of the DQS signal, the input registers 730 latch a first N/2 bit DQ word and the associated DM signals, and in response to a falling edge of the DQS signal the input registers latch the second N/2 bit DQ word and associated DM signals. The input register 730 provides the two latched N/2 bit DQ words as an N-bit word to a write FIFO and driver 732, which clocks the applied DQ word and DM signals into the write FIFO and driver in response to the DQS signal. The DQ word is clocked out of the write FIFO and driver 732 in response to the CLK signal, and is applied to the I/O gating and masking circuit 718. The I/O gating and masking circuit 718 transfers the DQ word to the addressed memory cells in the accessed bank 712A–D subject to the DM signals, which may be used to selectively mask bits or groups of bits in the DQ words (i.e., in the write data) being written to the addressed memory cells.

A control logic and command decoder 734 receives a plurality of command and clocking signals over a control bus CONT, typically from an external circuit such as a memory controller (not shown). The command signals include a chip select signal CS*, a write enable signal WE*, a column address strobe signal CAS*, and a row address strobe signal RAS*, while the clocking signals include a clock enable signal CKE* and complementary clock signals CLK, CLK*, with the "*" designating a signal as being active low. The command signals CS*, WE*, CAS*, and RAS* are driven to values corresponding to a particular command, such as a read, write, or auto-refresh command. In response to the clock signals CLK, CLK*, the command decoder 734 latches and decodes an applied command, and generates a sequence of clocking and control signals that control the components 702–732 to execute the function of the applied command. The clock enable signal CKE enables clocking of the command decoder 734 by the clock signals CLK, CLK*. The command decoder 734 latches command and address signals at positive edges of the CLK, CLK* signals (i.e., the crossing point of CLK going high and CLK* going low), while the input registers 730 and data drivers 724 transfer data into and from, respectively, the memory device 700 in response to both edges of the data strobe signal DQS and thus at double the frequency of the clock signals CLK, CLK*. This is true because the DQS signal has the same frequency as the CLK, CLK* signals. The memory device 700 is referred to as a double-data-rate device because the data words DQ being transferred to and from the device are transferred at double the rate of a conventional SDRAM, which transfers data at a rate corresponding to the frequency of the applied clock signal. The detailed operation of the control logic and command decoder 734 in generating the control and timing signals is conventional, and thus, for the sake of brevity, will not be described in more detail.

Figure 8:
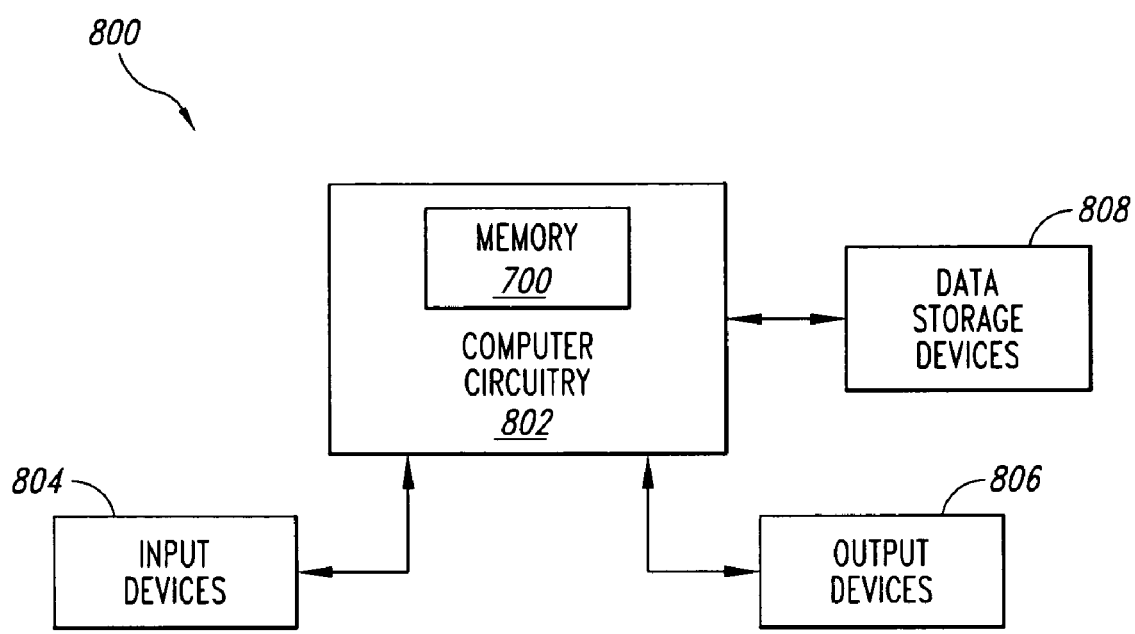
FIG. 8 is a functional block diagram illustrating a computer system including a synchronous memory device of FIG. 7.

FIG. 8 is a block diagram of a computer system 800 including computer circuitry 802 including the memory device 700 of FIG. 7. Typically, the computer circuitry 802 is coupled through address, data, and control buses to the memory device 700 to provide for writing data to and reading data from the memory device. The computer circuitry 802 includes circuitry for performing various computing functions, such as executing specific software to perform specific calculations or tasks. In addition, the computer system 800 includes one or more input devices 804, such as a keyboard or a mouse, coupled to the computer circuitry 802 to allow an operator to interface with the computer system. Typically, the computer system 800 also includes one or more output devices 806 coupled to the computer circuitry 802, such as output devices typically including a printer and a video terminal. One or more data storage devices 808 are also typically coupled to the computer circuitry 802 to store data or retrieve data from external storage media (not shown). Examples of typical storage devices 808 include hard and floppy disks, tape cassettes, compact disk read-only (CD-ROMs) and compact disk read-write (CD-RW) memories, and digital video disks (DVDs).

From the foregoing it will be appreciated that, although specific embodiments of the invention have been described herein for purposes of illustration, various modifications may be made without deviating from the spirit and scope of the invention. Such modifications are well within the skill of those ordinarily skilled in the art. Accordingly, the invention is not limited except as by the appended claims.

What is claimed is:

1. A clock generator for generating an output clock signal synchronized with an input clock signal and having a corrected duty cycle, the clock generator comprising:
an input buffer having an input to which the input clock is coupled and an output, the input buffer configured to buffer the input clock signal and generate a buffered clock signal;
an output buffer having first and second inputs and further having an output at which the output clock signal is provided, the output buffer configured to generate the output clock signal in response to clock signals applied to the first and second inputs;
an adjustable delay circuit having an input coupled to the output of the input buffer, an output, and a control node, and further having a half-delay tap coupled to the first input of the output buffer, the adjustable delay circuit configured to generate a full-delayed clock signal having an adjustable delay relative to the buffered clock signal according to an delay adjustment signal applied to the control node and further generate a half-delayed clock signal having one-half the adjustable delay relative to the buffered clock signal, the full-delay clock signal provided at the output of the adjustable delay and the half-delayed clock signal provided at the half-delay tap;

a fixed delay circuit having an input coupled to the output of the adjustable delay circuit and further having an output coupled to the second input of the output buffer, the fixed delay circuit configured to generate a delayed clock signal having a fixed delay relative to the full-delayed clock signal; and an adjustable delay circuit controller coupled to the adjustable delay circuit and the output of the input buffer, the adjustable delay circuit controller configured to adjust the adjustable delay to provide a forward delay equal to an odd multiple of a period of the input clock signal, the forward delay including an input buffer delay of the input buffer, the adjustable delay, the first fixed delay, and an output buffer delay of the output buffer.

2. The clock generator of claim 1 wherein the fixed delay circuit comprises a first fixed delay circuit and wherein adjustable delay circuit controller comprises:

a second fixed delay having an input coupled to the first fixed delay and having an output, the second fixed delay circuit configured to generate a feedback signal at the output having a second fixed delay relative to a clock signal applied to the input;

a phase detector having a first input coupled to the output of the input buffer and a second input coupled to the output of the second fixed delay, the phase detector configured to generate a control signal having a logic level indicative of the relative phases of the buffered clock signal and the feedback signal; and a shift register having a shift node coupled to the output of the phase detector and further having an output coupled to the control node of the adjustable delay circuit, the shift register generating the delay adjustment signal according to the control signal from the phase detector.

3. The clock generator of claim 2 wherein the input of the second fixed delay circuit is coupled to the output of the first fixed delay and the second delay is equal to the first delay.

4. The clock generator of claim 2 wherein the input of the second fixed delay circuit is coupled to the input of the first fixed delay circuit and the second delay is equal to twice the first delay.

5. The clock generator of claim 4 wherein the second fixed delay circuit comprises two fixed delay circuits coupled in series, each of the two fixed delay circuits having a respective fixed delay equal to the first fixed delay.

6. A clock generator for generating an output clock signal synchronized with an input clock signal and having a corrected duty cycle, the clock generator comprising:

an input buffer having an input to which the input clock is coupled and an output, the input buffer configured to buffer the input clock signal and generate a buffered clock signal;

an output buffer having first and second inputs and further having an output at which the output clock signal is provided, the output buffer configured to generate the output clock signal in response to clock signals applied to the first and second inputs;

an adjustable delay circuit having an input coupled to the output of the input buffer, an output, and a control node, and further having a half-delay tap coupled to the first input of the output buffer, the adjustable delay circuit configured to generate a full-delayed clock signal having an adjustable delay relative to the buffered clock signal according to an delay adjustment signal applied to the control node and further generate a half-delayed clock signal having one-half the adjustable delay relative to the buffered clock signal, the full-delay clock signal provided at the output of the adjustable delay and the half-delayed clock signal provided at the half-delay tap;

a first fixed delay circuit having an input coupled to the output of the adjustable delay circuit and further having an output coupled to the second input of the output buffer, the first fixed delay circuit configured to generate a delayed clock signal having a first fixed delay relative to the full-delayed clock signal;

a second fixed delay circuit having an input coupled to the output of the adjustable delay circuit and further having an output, the second fixed delay circuit configured to generate a feedback clock signal having a second fixed delay relative to the full-delayed clock signal that is equal to twice the first delay; and a phase detector having a first input coupled to the output of the input buffer, a second input coupled to the output of the second fixed delay circuit, and an output coupled to the control node of the adjustable delay circuit, the phase detector configured to generate the delay adjustment signal to adjust the adjustable delay according to the relative phase of the buffered clock signal and the feedback clock signal.

7. The clock generator of claim 6 wherein the adjustable delay circuit comprises first and second adjustable delay circuits coupled in series, each of the first and second adjustable delay circuits having a control node coupled to the output of the phase detector and configured to generate an output clock signal having a respective delay relative to an input clock signal according to a respective delay adjustment signal provided by the phase comparator, the half-delayed clock signal provided at the output of the first adjustable delay circuit and the full-delayed clock signal provided at the output of the second adjustable delay circuit.

8. The clock generator of claim 6 wherein the input buffer comprises an input buffer having an input buffer delay and the output buffer comprises an output buffer having an output buffer delay, and wherein the first fixed delay circuit comprises a model delay circuit having a model delay equal to the sum of the input buffer delay and the output buffer delay.

9. The clock generator of claim 6 wherein the second fixed delay circuit comprises two fixed delay circuits coupled in series, each of the two fixed delay circuits having a respective delay equal to the first delay.

10. The clock generator of claim 6 wherein the phase detector comprises:

a phase detector circuit having a first input coupled to the output of the input buffer and having a second input coupled to the output of the second fixed delay, the phase detector circuit further having an output node, the phase detector circuit configured to generate an output signal having a logic level indicative of the phase relationship between the buffered clock signal and the feedback clock signal; and a shift register having a shift node coupled to the output node of the phase detector circuit and having an output node coupled to the control node of the adjustable delay circuit, the shift register configured to generate a delay adjustment signal for adjusting the adjustable delay in response to the output signal of the phase detector circuit.

11. A clock generator for generating an output clock signal synchronized with an input clock signal and having a corrected duty cycle, the clock generator comprising:
an input buffer having an input to which the input clock is coupled and an output, the input buffer configured to buffer the input clock signal and generate a buffered clock signal;
an output buffer having first and second inputs and further having an output at which the output clock signal is provided, the output buffer configured to generate the output clock signal in response to clock signals applied to the first and second inputs;
an adjustable delay circuit having an input coupled to the output of the input buffer, an output, and a control node, and further having a half-delay tap coupled to the first input of the output buffer, the adjustable delay circuit configured to generate a full-delayed clock signal having an adjustable delay relative to the buffered clock signal according to an delay adjustment signal applied to the control node and further generate a half-delayed clock signal having one-half the adjustable delay relative to the buffered clock signal, the full-delay clock signal provided at the output of the adjustable delay and the half-delayed clock signal provided at the half-delay tap;
a first fixed delay circuit having an input coupled to the output of the adjustable delay circuit and further having an output coupled to the second input of the output buffer, the first fixed delay circuit configured to generate a delayed clock signal having a first fixed delay relative to the full-delayed clock signal;
a second fixed delay circuit having an input coupled to the output of the first fixed delay and further having an output, the second fixed delay circuit configured to generate a feedback clock signal having a second fixed delay relative to the full-delayed clock signal that is equal to first delay; and
a phase detector having a first input coupled to the output of the input buffer, a second input coupled to the output of the second fixed delay circuit, and an output coupled to the control node of the adjustable delay circuit, the phase detector configured to generate the delay adjustment signal to adjust the adjustable delay according to the relative phase of the buffered clock signal and the feedback clock signal.

12. The clock generator of claim 11 wherein the adjustable delay circuit comprises first and second adjustable delay circuits coupled in series, each of the first and second adjustable delay circuits having a control node coupled to the output of the phase detector and configured to generate an output clock signal having a respective delay relative to an input clock signal according to a respective delay adjustment signal provided by the phase comparator, the half-delayed clock signal provided at the output of the first adjustable delay circuit and the full-delayed clock signal provided at the output of the second adjustable delay circuit.

13. The clock generator of claim 11 wherein the input buffer comprises an input buffer having an input buffer delay and the output buffer comprises an output buffer having an output buffer delay, and wherein the first fixed delay circuit comprises a model delay circuit having a model delay equal to the sum of the input buffer delay and the output buffer delay.

14. The clock generator of claim 11 wherein the second fixed delay circuit comprises two fixed delay circuits coupled in series, each of the two fixed delay circuits having a respective delay equal to the first delay.

15. The clock generator of claim 11 wherein the phase detector comprises:
a phase detector circuit having a first input coupled to the output of the input buffer and having a second input coupled to the output of the second fixed delay, the phase detector circuit further having an output node, the phase detector circuit configured to generate an output signal having a logic level indicative of the phase relationship between the buffered clock signal and the feedback clock signal; and
a shift register having a shift node coupled to the output node of the phase detector circuit and having an output node coupled to the control node of the adjustable delay circuit, the shift register configured to generate a delay adjustment signal for adjusting the adjustable delay in response to the output signal of the phase detector circuit.

16. A memory device, comprising:
an address bus;
a control bus;
a data bus;
an address decoder coupled to the address bus;
a read/write circuit coupled to the data bus;
a control circuit coupled to the control bus;
a memory-cell array coupled to the address decoder, control circuit, and read/write circuit; and
a clock generator coupled to the control circuit, the clock generator configured to generate an output clock signal synchronized with an input clock signal and having a corrected duty cycle, the clock generator comprising:
an input buffer having an input to which the input clock is coupled and an output, the input buffer configured to buffer the input clock signal and generate a buffered clock signal;
an output buffer having first and second inputs and further having an output at which the output clock signal is provided, the output buffer configured to generate the output clock signal in response to clock signals applied to the first and second inputs;
an adjustable delay circuit having an input coupled to the output of the input buffer, an output, and a control node, and further having a half-delay tap coupled to the first input of the output buffer, the adjustable delay circuit configured to generate a full-delayed clock signal having an adjustable delay relative to the buffered clock signal according to an delay adjustment signal applied to the control node and further generate a half-delayed clock signal having one-half the adjustable delay relative to the buffered clock signal, the full-delay clock signal provided at the output of the adjustable delay and the half-delayed clock signal provided at the half-delay tap;
a fixed delay circuit having an input coupled to the output of the adjustable delay circuit and further having an output coupled to the second input of the output buffer, the fixed delay circuit configured to generate a delayed clock signal having a fixed delay relative to the full-delayed clock signal; and
an adjustable delay circuit controller coupled to the adjustable delay circuit and the output of the input buffer, the adjustable delay circuit controller configured to adjust the adjustable delay to provide a forward delay equal to an odd multiple of a period of the input clock signal, the forward delay including an input buffer delay of the input buffer, the adjustable delay, the first fixed delay, and an output buffer delay of the output buffer.

17. The memory device of claim 16 wherein the fixed delay circuit of the clock generator comprises a first fixed delay circuit and wherein adjustable delay circuit controller comprises:
- a second fixed delay having an input coupled to the first fixed delay and having an output, the second fixed delay circuit configured to generate a feedback signal at the output having a second fixed delay relative to a clock signal applied to the input;
- a phase detector having a first input coupled to the output of the input buffer and a second input coupled to the output of the second fixed delay, the phase detector configured to generate a control signal having a logic level indicative of the relative phases of the buffered clock signal and the feedback signal; and
- a shift register having a shift node coupled to the output of the phase detector and further having an output coupled to the control node of the adjustable delay circuit, the shift register generating the delay adjustment signal according to the control signal from the phase detector.

18. The memory device of claim 17 wherein the input of the second fixed delay circuit is coupled to the output of the first fixed delay and the second delay is equal to the first delay.

19. The memory device of claim 17 wherein the input of the second fixed delay circuit is coupled to the input of the first fixed delay circuit and the second delay is equal to twice the first delay.

20. The memory device of claim 10 wherein the second fixed delay circuit of the clock generator comprises two fixed delay circuits coupled in series, each of the two fixed delay circuits having a respective fixed delay equal to the first fixed delay.

21. A memory device, comprising:
- an address bus;
- a control bus;
- a data bus;
- an address decoder coupled to the address bus;
- a read/write circuit coupled to the data bus;
- a control circuit coupled to the control bus;
- a memory-cell array coupled to the address decoder, control circuit, and read/write circuit; and
- a clock generator coupled to the control circuit, the clock generator configured to generate an output clock signal synchronized with an input clock signal and having a corrected duty cycle, the clock generator comprising:
  - an input buffer having an input to which the input clock is coupled and an output, the input buffer configured to buffer the input clock signal and generate a buffered clock signal;
  - an output buffer having first and second inputs and further having an output at which the output clock signal is provided, the output buffer configured to generate the output clock signal in response to clock signals applied to the first and second inputs;
  - an adjustable delay circuit having an input coupled to the output of the input buffer, an output, and a control node, and further having a half-delay tap coupled to the first input of the output buffer, the adjustable delay circuit configured to generate a full-delayed clock signal having an adjustable delay relative to the buffered clock signal according to an delay adjustment signal applied to the control node and further generate a half-delayed clock signal having one-half the adjustable delay relative to the buffered clock signal, the full-delay clock signal provided at the output of the adjustable delay and the half-delayed clock signal provided at the half-delay tap;
  - a first fixed delay circuit having an input coupled to the output of the adjustable delay circuit and further having an output coupled to the second input of the output buffer, the first fixed delay circuit configured to generate a delayed clock signal having a first fixed delay relative to the full-delayed clock signal;
  - a second fixed delay circuit having an input coupled to the output of the adjustable delay circuit and further having an output, the second fixed delay circuit configured to generate a feedback clock signal having a second fixed delay relative to the full-delayed clock signal that is equal to twice the first delay; and
  - a phase detector having a first input coupled to the output of the input buffer, a second input coupled to the output of the second fixed delay circuit, and an output coupled to the control node of the adjustable delay circuit, the phase detector configured to generate the delay adjustment signal to adjust the adjustable delay according to the relative phase of the buffered clock signal and the feedback clock signal.

22. The memory device of claim 21 wherein the adjustable delay circuit of the clock generator comprises first and second adjustable delay circuits coupled in series, each of the first and second adjustable delay circuits having a control node coupled to the output of the phase detector and configured to generate an output clock signal having a respective delay relative to an input clock signal according to a respective delay adjustment signal provided by the phase comparator, the half-delayed clock signal provided at the output of the first adjustable delay circuit and the full-delayed clock signal provided at the output of the second adjustable delay circuit.

23. The memory device of claim 21 wherein the input buffer of the clock generator comprises an input buffer having an input buffer delay and the output buffer comprises an output buffer having an output buffer delay, and wherein the first fixed delay circuit comprises a model delay circuit having a model delay equal to the sum of the input buffer delay and the output buffer delay.

24. The memory device of claim 21 wherein the second fixed delay circuit of the clock generator comprises two fixed delay circuits coupled in series, each of the two fixed delay circuits having a respective delay equal to the first delay.

25. The memory device of claim 21 wherein the phase detector of the clock generator comprises:
- a phase detector circuit having a first input coupled to the output of the input buffer and having a second input coupled to the output of the second fixed delay, the phase detector circuit further having an output node, the phase detector circuit configured to generate an output signal having a logic level indicative of the phase relationship between the buffered clock signal and the feedback clock signal; and
- a shift register having a shift node coupled to the output node of the phase detector circuit and having an output node coupled to the control node of the adjustable delay circuit, the shift register configured to generate a delay adjustment signal for adjusting the adjustable delay in response to the output signal of the phase detector circuit.

26. A memory device, comprising:
an address bus;
a control bus;
a data bus;
an address decoder coupled to the address bus;
a read/write circuit coupled to the data bus;
a control circuit coupled to the control bus;
a memory-cell array coupled to the address decoder, control circuit, and read/write circuit; and
a clock generator coupled to the control circuit, the clock generator configured to generate an output clock signal synchronized with an input clock signal and having a corrected duty cycle, the clock generator comprising:
  an input buffer having an input to which the input clock is coupled and an output, the input buffer configured to buffer the input clock signal and generate a buffered clock signal;
  an output buffer having first and second inputs and further having an output at which the output clock signal is provided, the output buffer configured to generate the output clock signal in response to clock signals applied to the first and second inputs;
  an adjustable delay circuit having an input coupled to the output of the input buffer, an output, and a control node, and further having a half-delay tap coupled to the first input of the output buffer, the adjustable delay circuit configured to generate a full-delayed clock signal having an adjustable delay relative to the buffered clock signal according to an delay adjustment signal applied to the control node and further generate a half-delayed clock signal having one-half the adjustable delay relative to the buffered clock signal, the full-delay clock signal provided at the output of the adjustable delay and the half-delayed clock signal provided at the half-delay tap;
  a first fixed delay circuit having an input coupled to the output of the adjustable delay circuit and further having an output coupled to the second input of the output buffer, the first fixed delay circuit configured to generate a delayed clock signal having a first fixed delay relative to the full-delayed clock signal;
  a second fixed delay circuit having an input coupled to the output of the first fixed delay and further having an output, the second fixed delay circuit configured to generate a feedback clock signal having a second fixed delay relative to the full-delayed clock signal that is equal to first delay; and
  a phase detector having a first input coupled to the output of the input buffer, a second input coupled to the output of the second fixed delay circuit , and an output coupled to the control node of the adjustable delay circuit, the phase detector configured to generate the delay adjustment signal to adjust the adjustable delay according to the relative phase of the buffered clock signal and the feedback clock signal.

27. The memory device of claim 26 wherein the adjustable delay circuit of the clock generator comprises first and second adjustable delay circuits coupled in series, each of the first and second adjustable delay circuits having a control node coupled to the output of the phase detector and configured to generate an output clock signal having a respective delay relative to an input clock signal according to a respective delay adjustment signal provided by the phase comparator, the half-delayed clock signal provided at the output of the first adjustable delay circuit and the full-delayed clock signal provided at the output of the second adjustable delay circuit.

28. The memory device of claim 26 wherein the input buffer of the clock generator comprises an input buffer having an input buffer delay and the output buffer comprises an output buffer having an output buffer delay, and wherein the first fixed delay circuit comprises a model delay circuit having a model delay equal to the sum of the input buffer delay and the output buffer delay.

29. The memory device of claim 26 wherein the second fixed delay circuit of the clock generator comprises two fixed delay circuits coupled in series, each of the two fixed delay circuits having a respective delay equal to the first delay.

30. The memory device of claim 26 wherein the phase detector of the clock generator comprises:
  a phase detector circuit having a first input coupled to the output of the input buffer and having a second input coupled to the output of the second fixed delay, the phase detector circuit further having an output node, the phase detector circuit configured to generate an output signal having a logic level indicative of the phase relationship between the buffered clock signal and the feedback clock signal; and
  a shift register having a shift node coupled to the output node of the phase detector circuit and having an output node coupled to the control node of the adjustable delay circuit, the shift register configured to generate a delay adjustment signal for adjusting the adjustable delay in response to the output signal of the phase detector circuit.

31. A computer processing system, comprising:
a data input device;
a data output device;
a processor coupled to the data input and output devices; and
a memory device coupled to the processor, the memory device comprising,
  an address bus;
  a control bus;
  a data bus;
  an address decoder coupled to the address bus;
  a read/write circuit coupled to the data bus;
  a control circuit coupled to the control bus;
  a memory-cell array coupled to the address decoder, control circuit, and read/write circuit; and
  a clock generator coupled to the control circuit, the clock generator configured to generate an output clock signal synchronized with an input clock signal and having a corrected duty cycle, the clock generator comprising:
    an input buffer having an input to which the input clock is coupled and an output, the input buffer configured to buffer the input clock signal and generate a buffered clock signal;
    an output buffer having first and second inputs and further having an output at which the output clock signal is provided, the output buffer configured to generate the output clock signal in response to clock signals applied to the first and second inputs;
    an adjustable delay circuit having an input coupled to the output of the input buffer, an output, and a control node, and further having a half-delay tap coupled to the first input of the output buffer, the adjustable delay circuit configured to generate a full-delayed clock signal having an adjustable delay relative to the buffered clock signal according to an delay adjustment signal applied to the control node and further generate a half-delayed clock signal having one-half the adjustable delay relative to the buffered clock signal, the full-delay clock signal provided at the output of the adjustable delay and the half-delayed clock signal provided at the half-delay tap;

a fixed delay circuit having an input coupled to the output of the adjustable delay circuit and further having an output coupled to the second input of the output buffer, the fixed delay circuit configured to generate a delayed clock signal having a fixed delay relative to the full-delayed clock signal; and an adjustable delay circuit controller coupled to the adjustable delay circuit and the output of the input buffer, the adjustable delay circuit controller configured to adjust the adjustable delay to provide a forward delay equal to an odd multiple of a period of the input clock signal, the forward delay including an input buffer delay of the input buffer, the adjustable delay, the first fixed delay, and an output buffer delay of the output buffer.

32. The computer processing system of claim 31 wherein the fixed delay circuit of the clock generator comprises a first fixed delay circuit and wherein adjustable delay circuit controller comprises:

a second fixed delay having an input coupled to the first fixed delay and having an output, the second fixed delay circuit configured to generate a feedback signal at the output having a second fixed delay relative to a clock signal applied to the input;

a phase detector having a first input coupled to the output of the input buffer and a second input coupled to the output of the second fixed delay, the phase detector configured to generate a control signal having a logic level indicative of the relative phases of the buffered clock signal and the feedback signal; and a shift register having a shift node coupled to the output of the phase detector and further having an output coupled to the control node of the adjustable delay circuit, the shift register generating the delay adjustment signal according to the control signal from the phase detector.

33. The computer processing system of claim 32 wherein the input of the second fixed delay circuit is coupled to the output of the first fixed delay and the second delay is equal to the first delay.

34. The computer processing system of claim 32 wherein the input of the second fixed delay circuit is coupled to the input of the first fixed delay circuit and the second delay is equal to twice the first delay.

35. The computer processing system of claim 34 wherein the second fixed delay circuit of the clock generator comprises two fixed delay circuits coupled in series, each of the two fixed delay circuits having a respective fixed delay equal to the first fixed delay.

36. A computer processing system, comprising:
a data input device;
a data output device;
a processor coupled to the data input and output devices; and
a memory device coupled to the processor, the memory device comprising, an address bus;
a control bus;
a data bus;
an address decoder coupled to the address bus;
a read/write circuit coupled to the data bus;
a control circuit coupled to the control bus;

a memory-cell array coupled to the address decoder, control circuit, and read/write circuit; and a clock generator coupled to the control circuit, the clock generator configured to generate an output clock signal synchronized with an input clock signal and having a corrected duty cycle, the clock generator comprising:

an input buffer having an input to which the input clock is coupled and an output, the input buffer configured to buffer the input clock signal and generate a buffered clock signal;

an output buffer having first and second inputs and further having an output at which the output clock signal is provided, the output buffer configured to generate the output clock signal in response to clock signals applied to the first and second inputs;

an adjustable delay circuit having an input coupled to the output of the input buffer, an output, and a control node, and further having a half-delay tap coupled to the first input of the output buffer, the adjustable delay circuit configured to generate a full-delayed clock signal having an adjustable delay relative to the buffered clock signal according to an delay adjustment signal applied to the control node and further generate a half-delayed clock signal having one-half the adjustable delay relative to the buffered clock signal, the full-delay clock signal provided at the output of the adjustable delay and the half-delayed clock signal provided at the half-delay tap;

a first fixed delay circuit having an input coupled to the output of the adjustable delay circuit and further having an output coupled to the second input of the output buffer, the first fixed delay circuit configured to generate a delayed clock signal having a first fixed delay relative to the full-delayed clock signal;

a second fixed delay circuit having an input coupled to the output of the adjustable delay circuit and further having an output, the second fixed delay circuit configured to generate a feedback clock signal having a second fixed delay relative to the full-delayed clock signal that is equal to twice the first delay; and a phase detector having a first input coupled to the output of the input buffer, a second input coupled to the output of the second fixed delay circuit, and an output coupled to the control node of the adjustable delay circuit, the phase detector configured to generate the delay adjustment signal to adjust the adjustable delay according to the relative phase of the buffered clock signal and the feedback clock signal.

37. The computer processing system of claim 36 wherein the adjustable delay circuit of the clock generator comprises first and second adjustable delay circuits coupled in series, each of the first and second adjustable delay circuits having a control node coupled to the output of the phase detector and configured to generate an output clock signal having a respective delay relative to an input clock signal according to a respective delay adjustment signal provided by the phase comparator, the half-delayed clock signal provided at the output of the first adjustable delay circuit and the full-delayed clock signal provided at the output of the second adjustable delay circuit.

38. The computer processing system of claim 36 wherein the input buffer of the clock generator comprises an input buffer having an input buffer delay and the output buffer comprises an output buffer having an output buffer delay, and wherein the first fixed delay circuit comprises a model delay circuit having a model delay equal to the sum of the input buffer delay and the output buffer delay.

39. The computer processing system of claim 36 wherein the second fixed delay circuit of the clock generator comprises two fixed delay circuits coupled in series, each of the two fixed delay circuits having a respective delay equal to the first delay.

40. The computer processing system of claim 36 wherein the phase detector of the clock generator comprises:
  a phase detector circuit having a first input coupled to the output of the input buffer and having a second input coupled to the output of the second fixed delay, the phase detector circuit further having an output node, the phase detector circuit configured to generate an output signal having a logic level indicative of the phase relationship between the buffered clock signal and the feedback clock signal; and
  a shift register having a shift node coupled to the output node of the phase detector circuit and having an output node coupled to the control node of the adjustable delay circuit, the shift register configured to generate a delay adjustment signal for adjusting the adjustable delay in response to the output signal of the phase detector circuit.

41. A computer processing system, comprising:
  a data input device;
  a data output device;
  a processor coupled to the data input and output devices; and
  a memory device coupled to the processor, the memory device comprising,
    an address bus;
    a control bus;
    a data bus;
    an address decoder coupled to the address bus;
    a read/write circuit coupled to the data bus;
    a control circuit coupled to the control bus;
    a memory-cell array coupled to the address decoder, control circuit, and read/write circuit; and
    a clock generator coupled to the control circuit, the clock generator configured to generate an output clock signal synchronized with an input clock signal and having a corrected duty cycle, the clock generator comprising:
      an input buffer having an input to which the input clock is coupled and an output, the input buffer configured to buffer the input clock signal and generate a buffered clock signal;
      an output buffer having first and second inputs and further having an output at which the output clock signal is provided, the output buffer configured to generate the output clock signal in response to clock signals applied to the first and second inputs;
      an adjustable delay circuit having an input coupled to the output of the input buffer, an output, and a control node, and further having a half-delay tap coupled to the first input of the output buffer, the adjustable delay circuit configured to generate a full-delayed clock signal having an adjustable delay relative to the buffered clock signal according to an delay adjustment signal applied to the control node and further generate a half-delayed clock signal having one-half the adjustable delay relative to the buffered clock signal, the full-delay clock signal provided at the output of the adjustable delay and the half-delayed clock signal provided at the half-delay tap;
      a first fixed delay circuit having an input coupled to the output of the adjustable delay circuit and further having an output coupled to the second input of the output buffer, the first fixed delay circuit configured to generate a delayed clock signal having a first fixed delay relative to the full-delayed clock signal;
      a second fixed delay circuit having an input coupled to the output of the first fixed delay and further having an output, the second fixed delay circuit configured to generate a feedback clock signal having a second fixed delay relative to the full-delayed clock signal that is equal to first delay; and
      a phase detector having a first input coupled to the output of the input buffer, a second input coupled to the output of the second fixed delay circuit , and an output coupled to the control node of the adjustable delay circuit, the phase detector configured to generate the delay adjustment signal to adjust the adjustable delay according to the relative phase of the buffered clock signal and the feedback clock signal.

42. The computer processing system of claim 41 wherein the adjustable delay circuit of the clock generator comprises first and second adjustable delay circuits coupled in series, each of the first and second adjustable delay circuits having a control node coupled to the output of the phase detector and configured to generate an output clock signal having a respective delay relative to an input clock signal according to a respective delay adjustment signal provided by the phase comparator, the half-delayed clock signal provided at the output of the first adjustable delay circuit and the full-delayed clock signal provided at the output of the second adjustable delay circuit.

43. The computer processing system of claim 41 wherein the input buffer of the clock generator comprises an input buffer having an input buffer delay and the output buffer comprises an output buffer having an output buffer delay, and wherein the first fixed delay circuit comprises a model delay circuit having a model delay equal to the sum of the input buffer delay and the output buffer delay.

44. The computer processing system of claim 41 wherein the second fixed delay circuit of the clock generator comprises two fixed delay circuits coupled in series, each of the two fixed delay circuits having a respective delay equal to the first delay.

45. The computer processing system of claim 41 wherein the phase detector of the clock generator comprises:
  a phase detector circuit having a first input coupled to the output of the input buffer and having a second input coupled to the output of the second fixed delay, the phase detector circuit further having an output node, the phase detector circuit configured to generate an output signal having a logic level indicative of the phase relationship between the buffered clock signal and the feedback clock signal; and
  a shift register having a shift node coupled to the output node of the phase detector circuit and having an output node coupled to the control node of the adjustable delay circuit, the shift register configured to generate a delay adjustment signal for adjusting the adjustable delay in response to the output signal of the phase detector circuit.

46. A method for generating a delayed clock signal synchronized with a reference clock signal and having a corrected duty cycle, the method comprising:

delaying the reference clock signal by a total delay equal to an odd multiple of a period of the reference clock signal, the total delay including an input buffer delay, an adjustable delay, a fixed delay, and an output buffer delay;

generating a first clock signal having a first delay relative to the reference clock signal equal to the input buffer delay and half of the adjustable delay;

generating a second clock signal having a second delay relative to the reference clock signal equal to the input buffer delay, the adjustable delay, and the fixed delay; and in a time equal to the output buffer delay, combining the first clock signal and a second clock signal to provide the delayed clock signal.

47. The method of claim 46 wherein generating the second clock signal comprises adjusting the adjustable delay until a feedback loop delay including the adjustable delay and twice the fixed delay is equal to an odd multiple of the period of the reference clock signal.

48. The method of claim 47 wherein generating the first clock signal comprises generating a clock signal leading the second clock signal by one-half of the adjustable delay and the fixed delay.

\* \* \* \* \*